(12) United States Patent
Kim et al.

(10) Patent No.: US 10,978,423 B2
(45) Date of Patent: Apr. 13, 2021

(54) PROJECTING CONTACTS AND METHOD FOR MAKING THE SAME

(71) Applicant: Intel Corporation, Santa Clara, CA (US)

(72) Inventors: Dae-Woo Kim, Phoenix, AZ (US); Sujit Sharan, Chandler, AZ (US); Ravindranath V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/781,998

(22) PCT Filed: Dec. 22, 2015

(86) PCT No.: PCT/US2015/067468
§ 371 (c)(1),
(2) Date: Jun. 6, 2018

(87) PCT Pub. No.: WO2017/111959
PCT Pub. Date: Jun. 29, 2017

(65) Prior Publication Data
US 2018/0366438 A1  Dec. 20, 2018

(51) Int. Cl.
*H01L 25/065* (2006.01)
*H01L 23/538* (2006.01)
(Continued)

(52) U.S. Cl.
CPC ...... *H01L 25/0655* (2013.01); *H01L 23/3107* (2013.01); *H01L 23/49811* (2013.01);
(Continued)

(58) Field of Classification Search
CPC ............. H01L 25/0655; H01L 23/3107; H01L 23/49811; H01L 23/5381; H01L 23/585; H01L 29/40; H01L 29/66
(Continued)

(56) References Cited

U.S. PATENT DOCUMENTS 8,064,224 B2  11/2011  Mahajan et al.
9,136,236 B2   9/2015  Starkston et al.
(Continued)

FOREIGN PATENT DOCUMENTS

WO  WO-2017111959 A1  6/2017

OTHER PUBLICATIONS

Narahashi, Hirohisa, "Low Df Build-up Material for High Frequency Signal Transmission of Substrates", The 63rd Electronic Components and Technology Conference (ECTC), (May 2013), 26 pgs.
(Continued)

*Primary Examiner* — Tong-Ho Kim
(74) *Attorney, Agent, or Firm* — Schwegman Lundberg & Woessner, P.A.

(57) ABSTRACT

A package assembly includes a substrate extending from a first substrate end to a second substrate end. A plurality of conductive traces extend along the substrate. A plurality of contacts are coupled with the respective conductive traces of the plurality of conductive traces. Each of the contacts of the plurality of contacts includes a contact pad coupled with a respective conductive trace of the plurality of conductive traces, and a contact post coupled with the contact pad, the contact post extends from the contact pad. A package cover layer is coupled over the plurality of contact posts. The plurality of contact posts are configured to penetrate the package cover layer and extend to a raised location above the package cover layer.

22 Claims, 7 Drawing Sheets

(51) Int. Cl.
*H01L 23/498* (2006.01)
*H01L 23/31* (2006.01)
*H01L 25/00* (2006.01)
*H01L 29/66* (2006.01)
*H01L 29/40* (2006.01)
*H01L 23/58* (2006.01)

(52) U.S. Cl.
CPC ........ *H01L 23/5381* (2013.01); *H01L 23/585* (2013.01); *H01L 25/50* (2013.01); *H01L 29/40* (2013.01); *H01L 29/66* (2013.01)

(58) Field of Classification Search
USPC .......................................................... 257/668
See application file for complete search history.

(56) References Cited

U.S. PATENT DOCUMENTS

| | | | |
|---|---|---|---|
| 2009/0108258 A1 | 4/2009 | An | |
| 2012/0146181 A1* | 6/2012 | Lin | H01L 24/19 257/531 |
| 2013/0334683 A1* | 12/2013 | Kim | H01L 23/49827 257/737 |
| 2014/0206184 A1 | 7/2014 | Haba et al. | |
| 2014/0321091 A1* | 10/2014 | Zhang | H05K 3/10 361/783 |
| 2014/0332966 A1 | 11/2014 | Xiu et al. | |
| 2015/0116965 A1 | 4/2015 | Kim et al. | |
| 2015/0364423 A1* | 12/2015 | Liu | H01L 24/33 257/751 |

OTHER PUBLICATIONS

"Embedded Multidie Interconnect Bridge: A breakthrough in advanced packaging technology", Intel Custom Foundry EMIB, [Online]. Retrieved from the Internet: <URL: http://www.intel.com/content/www/us/en/foundry/emib.html>, (Accessed on: Feb. 3, 2016), 8 pgs.

"International Application Serial No. PCT/US2015/067468, International Search Report dated Aug. 31, 2016", 3 pgs.

"International Application Serial No. PCT/US2015/067468, Written Opinion dated Aug. 31, 2016", 10 pgs.

Sankman, "High Density Chip to Chip Communications with Intel EMIB Technology", Intel Corporation-Assembly Technology Development, (Nov. 2015), 23 pgs.

"International Application Serial No. PCT US2015 067468, International Preliminary Report on Patentability dated Jul. 5, 2018", 12 pgs.

* cited by examiner

PROJECTING CONTACTS AND METHOD FOR MAKING THE SAME

CLAIM OF PRIORITY

This patent application is a U.S. National Stage Application under 35 U.S.C. 371 from International Application No. PCT/US2015/067468, filed Dec. 22, 2015, published as WO 2017/111959, which is incorporated herein by reference.

TECHNICAL FIELD

Embodiments described herein generally relate to contacts and contact arrays providing electrical connections in device packages.

BACKGROUND

Packages including devices such as semiconductors include a plurality (e.g., thousands) of conductive traces. Contacts including contact pads, vias, solder balls, pins or the like provide terminals for connection with devices and facilitate interconnections between devices. In some examples a substrate is provided that includes a silicon plate extending beneath each of a plurality of component devices. The silicon plate has a footprint (shape) matching or nearly matching the overall footprint of the combined component devices. The silicon plate includes the interconnections between the devices including conductive traces, contact pads and the like. In some examples, the contacts (pads, vias, solder balls or the like) number in the thousands, for instance twenty to forty thousand contacts or more.

Contacts are formed in one example with laser cut vias for each of the contacts within one or more layers of the package, for instance a package built up with an Ajinomoto Build-up Film (ABF) method. Each of the multiple thousand vias are cut into the ABF to provide access to an underlying contact pad on the silicon plate. Ultraviolet (UV) and $CO_2$ lasers are used to form vias. After laser cutting the vias are copper plated and raised pads (e.g., Nickel pads) are applied over the vias.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Figure 1:
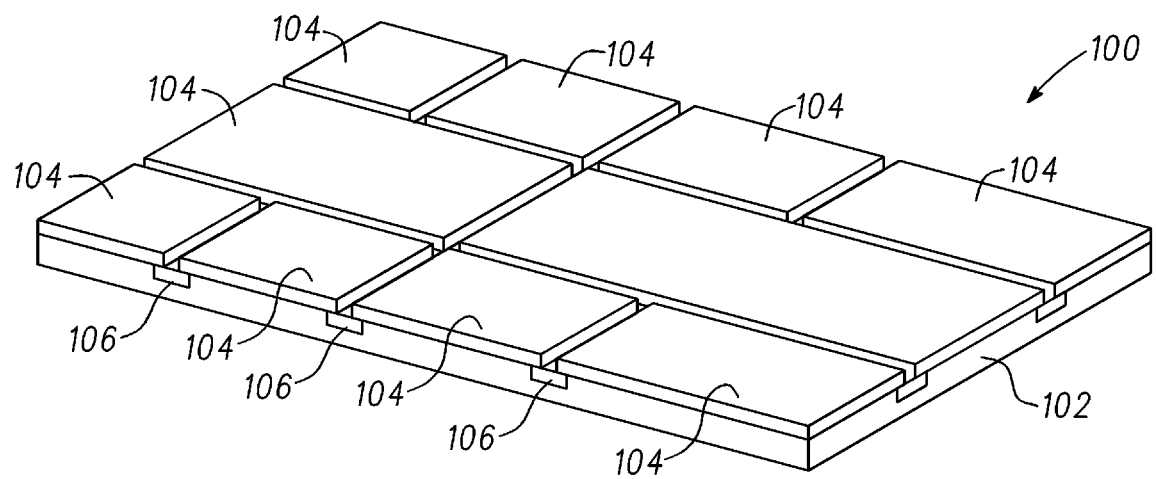
FIG. 1 is a perspective view of one example of a composite package assembly.

As described herein, in some examples thousands of vias are formed on silicon plates to provide interconnections between devices. The vias are formed with lasers that cut the vias into package material (e.g., ABF film) covering the contact pads. In some examples, one or more vias are misaligned with the respective contact pads and the one or more plated vias fail to communicate with the specified contact pads. Misalignment occurs through one or more of laser generator misalignment to the specified contact pad or misalignment of the contact pad relative to the laser generator. In other examples, the lasers (e.g., UV or $CO_2$ lasers) cut vias that are either shallow or deep and respective fail to reach the contact pad or cut through the pad. Whether because of misalignment or one or more of under or over cutting (e.g., shallow or deep) poor or open connections are formed. Further still, laser cutting is a time consuming process that is further lengthened by the 20 to 40 thousand (or more) vias that are laser cut in some packages. Each of the vias are potentially misaligned, shallow or deep with respect to internal conductive traces or contacts and accordingly may cause the entire package to fail and require discarding. Stated another way, each of the thousands of laser cut vias potentially introduce a source of error and corresponding failure of the overall package.

The present subject matter can help provide a solution to these problems, such as by an array of contacts having contact posts that are self-aligned relative to underlying contact pads. The contact posts are formed on the contact pads (e.g., self-aligned) and then penetrate through the applied package cover layer. In one example, the contact posts are formed in a batch process (e.g., patterning with photoresist and etchant) on a corresponding number of contact pads of a substrate. The contact posts are aligned with the contact pads during formation (e.g., patterning) and accordingly are self-aligned in contrast to forming vias by first attempting to align a laser with the specified contact pad and cutting through a package cover layer. With the contact posts the package cover layer is automatically penetrated by the posts either during overlaying of the layer or subsequent processing of the layer (washing, polishing, laser based cleaning, chemical or plasma etch or the like). As described herein the contact posts are provided on a substrate including, but not limited to, a package substrate such as a silicon panel, Embedded Multi-Die Interconnect Bridge (EMIB) or the like. Further, the contact posts are formed on component contacts (in addition to contacts for conductive traces). That is to say one or more components including, but not limited to, capacitors, inductors or the like are embedded in the package substrate. The contact posts, in another example, are formed on the contact pads for these components.

Because the contact posts are aligned with the contact pads during formation, and prior to application of the package cover layer, the alignment of the contact posts is not controlled by formation of vias (including alignment of a laser and cutting to the desired depth) in the package cover layer. Instead, the contact posts are already provided on the contact pads, are in full communication with the respective contact pads, and penetrate the package cover layer (ABF) in a manner reverse to formation with laser cutting. Further, failures caused by one or more of misalignment of a laser to contact pads and corresponding misaligned vias or shallow or deep cutting of vias in the package cover layer by the laser are minimized (e.g., minimized or eliminated) because the contact posts are formed on the contact pads. Additionally, labor and time intensive laser cutting of vias is minimized (e.g., minimized or eliminated) by forming the contact posts, for instance by patterning.

This overview is intended to provide an overview of subject matter of the present patent application. It is not intended to provide an exclusive or exhaustive explanation of the invention. The detailed description is included to provide further information about the present patent application.

FIG. 1 shows a perspective view of one example of a composite device assembly 100 (e.g., an exemplary package assembly). As shown, the composite device assembly 100 includes a package body 102 forming a substrate for supporting one or more devices such as the devices 104 shown on the package body 102. The composite device assembly 100 provides a monolithic base for reception of the plurality of devices 104 and interconnection of the devices. In the example shown in FIG. 1, the composite device assembly 100 includes a plurality of bridges 106 providing interconnections between the devices 104. As will be described herein the bridges 106 are locally positioned relative to adjacent devices 104 and provide interconnections to allow for communication (and optionally the delivery of power) between the devices 104. As will be described in detail herein, the connections provided by the bridges 106 for instance including one or more contacts are formed with a method that does not use laser cutting or the like to form vias within the package body 102 (e.g., vias that are plated and then covered with projections, such as nickel pads). Instead, the bridges 106 include a plurality of contacts configured to extend through (penetrate) the cover layer of the package body 102 and avoid the laser cutting process and application of projecting pads, such as solder dots, over plated vias extending through the package body 102. The bridges 106 as described herein include a plurality of contact posts formed on contact pads prior to application of a cover layer. The contact posts having penetrating faces configured to pierce or penetrate through the applied cover layer of the package body 102 (including the cover layer of the bridge 106). The contact posts formed on the contact pads (e.g., of the bridge 106 or in another package assembly) are automatically aligned with the contact pads and conductive traces because they are formed directly on the pads (e.g., including the traces) without first aligning a laser and cutting through an existing cover layer.

Figure 2:
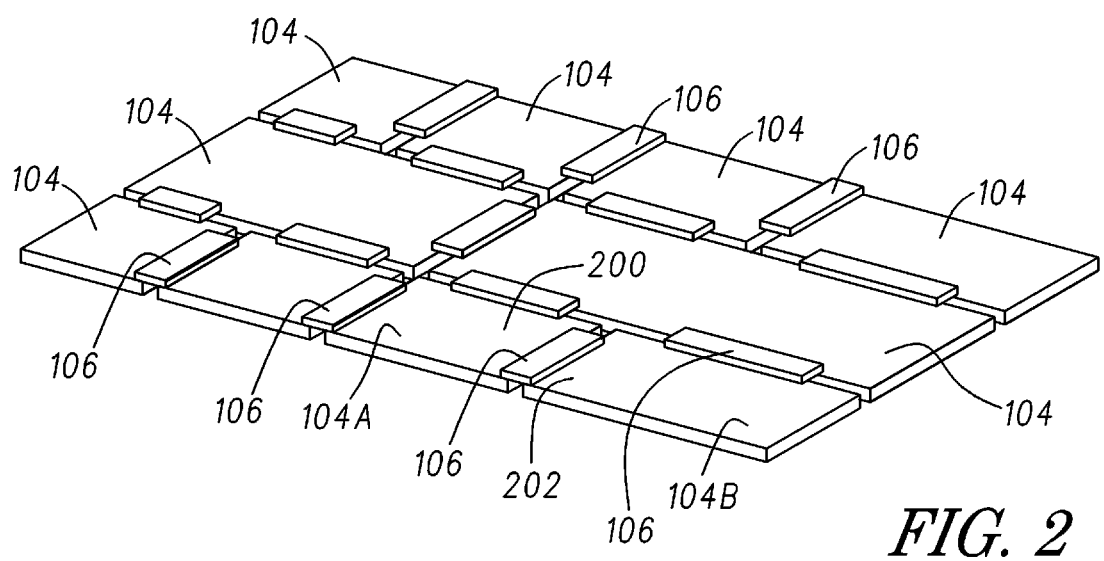
FIG. 2 is a perspective view of a portion of the composite package assembly of FIG. 1.

Referring to FIG. 2, the composite device assembly 100 is shown in an inverted configuration with the package body 102 removed for illustration purposes. As shown a plurality of bridges 106 (e.g., examples of package assemblies) are shown interconnected between the various devices 104. For instance each of the devices 104 optionally includes a bridge 106 provided between itself and one or more of the adjacent devices 104 of the composite device assembly 100. As shown, each of the bridges 106 provides interconnections between adjacent devices 104. Distributed features such as silicon interposers (plates) extending across the majority of the package body 102 and providing the overall distributed series of interconnections between the devices 104 are accordingly avoided. Stated another way, the bridges 106 provide localized interconnections between the devices 104 without needing a larger silicon interposer provided within the package body 102. Further, the silicon interposers, in at least some examples, are smaller than the overall footprint of the devices 104 of the composite device assembly 100 and interconnections between peripheral devices (as opposed to interconnections with centrally located devices and peripheral devices) may not be available as the interposer fails to extent to the perimeter of the assembly 100.

Referring again to FIG. 2, exemplary first and second devices 104A, 104B are shown in particular. The first and second devices 104A, 104B include corresponding first and second device edges 200, 202. The interconnecting bridge 106 shown between the first and second devices 104A, 104B includes a plurality of contacts (including contact posts as described herein) configured for interconnection with the first and second devices 104A, 104B, for instance at the corresponding first and second device edges 200, 202. As will be described in detail herein, the contact posts of the bridge 106 (one example of the package assembly) are automatically aligned with underlying contact pads and conductive traces of the bridge 106 and thereby ensure corresponding automatic electrical coupling (and communication) between the first and second devices 104A, 104B. Stated another way, manufacturing and assembly issues including, but not limited to, misalignment of lasers and corresponding misaligned cutting of vias into a package body 102 for instance by way of ultraviolet or carbon dioxide (CO2) lasers are thereby avoided. Additionally other manufacturing issues, such as cutting vias too shallow or too deep into the bridges 106 or the package body 102 are avoided. Instead, the automatically aligned contact posts of the bridge 106 (e.g., an example of the package assembly) ensure the contacts reliably extend from the specified conductive traces for corresponding reliable electrical communication between the devices such as the first and second devices 104A, 104B shown in FIG. 2.

Figure 3:
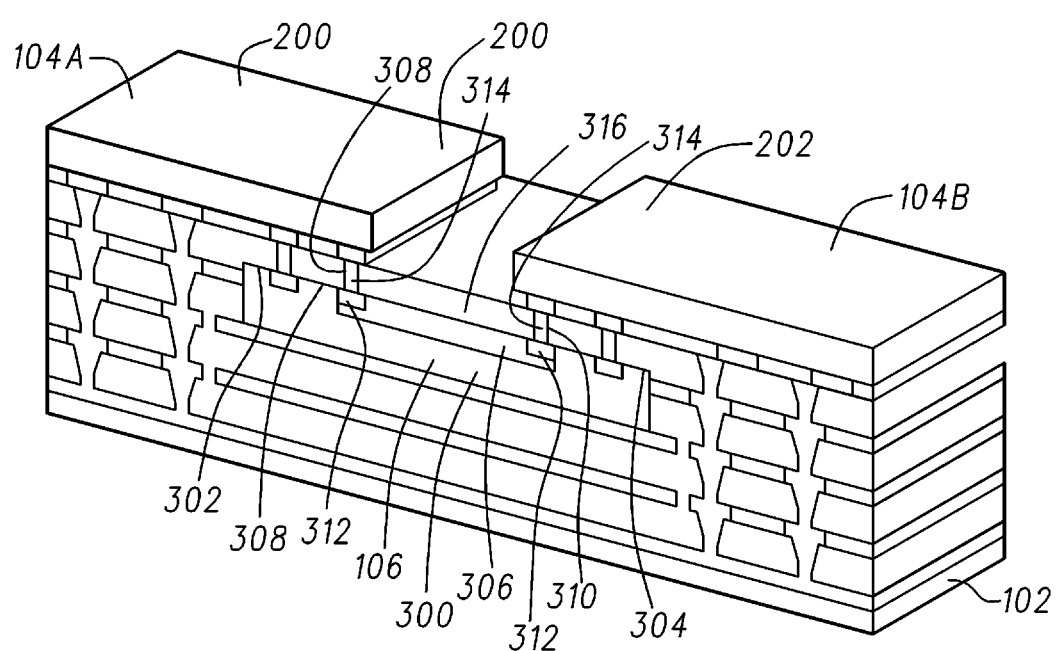
FIG. 3 is a detailed perspective view of one example of a package assembly including a bridge.

Referring now to FIG. 3, a detailed view of a portion of the composite device assembly 100 (an exemplary package assembly) shown in FIGS. 1 and 2 is provided. The first and second devices 104A, 104B are shown in part in FIG. 3. The bridge 106 (an example of the package assembly) is shown interconnected between the first and second devices 104A, 104B. As further shown in FIG. 3 the bridge 106 is electrically coupled with the first and second devices 104A, 104B proximate to the respective first and second device edges 200, 202.

Referring again to FIG. 3, the package body 102 is shown around the bridge assembly 106 and underlying the first and second devices 104A, 104B. As will be described herein, in one example one or more bridges 106 are positioned within the package body 102 (see FIG. 1) for eventual coupling and interconnection with the devices 104 including for instance the first and second devices 104A, 104B shown in FIG. 3. In another example, the bridge 106 or another package assembly including the features described herein are provided for interconnection between exemplary devices in another packages for instance, dedicated packages that provide interconnections to one or more devices on a substrate, for instance a substrate smaller than the package body 102 shown in FIG. 1. That is to say, a package assembly, such as the bridge 106, is used separately relative to an overall composite device assembly 100 for connection to one or more devices.

Referring again to FIG. 3, the bridge 106 includes a substrate 300 extending between first and second substrate ends 302, 304. In one example, the first substrate end 302 underlies a portion of the first device edge 200 of the first device 104A. Similarly, the second substrate end 304 underlies a portion of the second device edge 202 of the second device 104B. The bridge 106 further includes at least one conductive trace 306 extending between the first and second substrate ends 302, 304. The conductive trace 306 interconnects the first and second devices 104A, 104B, for instance by way of contact pads 312 (and associated contacts 308, 310) provided at either end of the conductive traces 306.

As further shown in FIG. 3, the bridge 106 includes first and second contacts 308, 310, in one example contact assemblies. The contacts of the bridge 106, such as the first and second contacts 308 include one or more components including a contact pad 312 and a respective contact post 314 extending from the contact pad 312. As further shown in FIG. 3 the respective contact posts 314 of the first and second contacts 308, 310 extend from the contact pads 312 (or the conductive trace 306) toward the first and second devices 104A, 104B (e.g., the first and second device edges 200, 202 respectively). As will be described herein, the contact posts 314 of the contacts 308, 310 are formed on the bridge 106 prior to deposition of a cover layer, such as the package cover layer 316 shown in FIG. 3. That is to say, the contact posts 314 are formed in an automatically aligned configuration (by one or more of patterning, deposition or the like) on the conductive traces 306 or contact pads 312. The package cover layer 316 is applied over the bridge 106 and the contact posts 314 including. Piercing faces of the contact posts 314 are passed through the package cover layer 316 to penetrate the package cover layer 316.

Figure 4A:
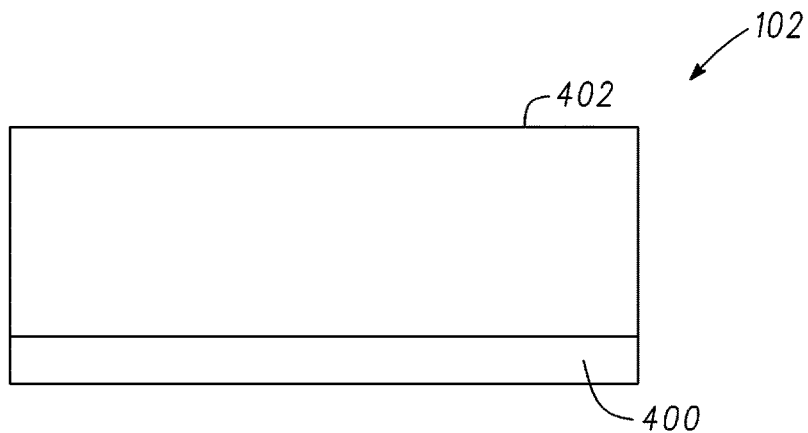
FIG. 4A is a schematic cross section of one example of a package body.
Figure 4B:
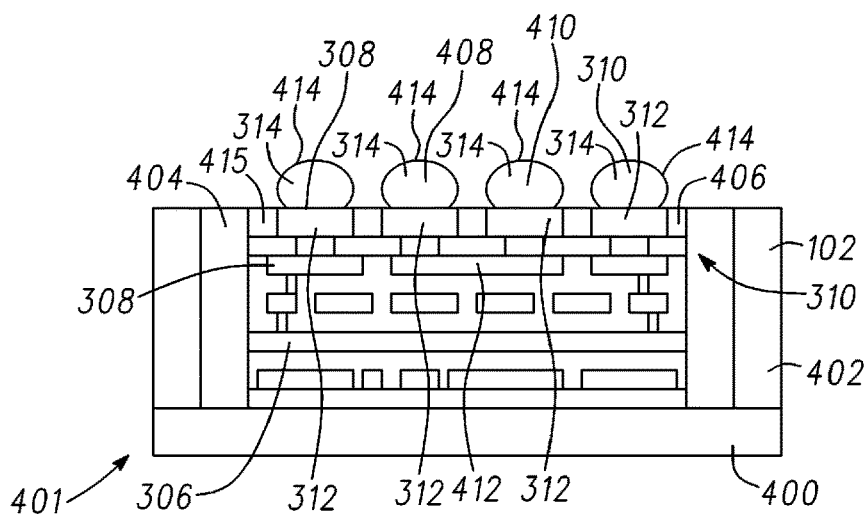
FIG. 4B is a schematic cross section of another example of a package assembly within a package body.
Figure 4C:
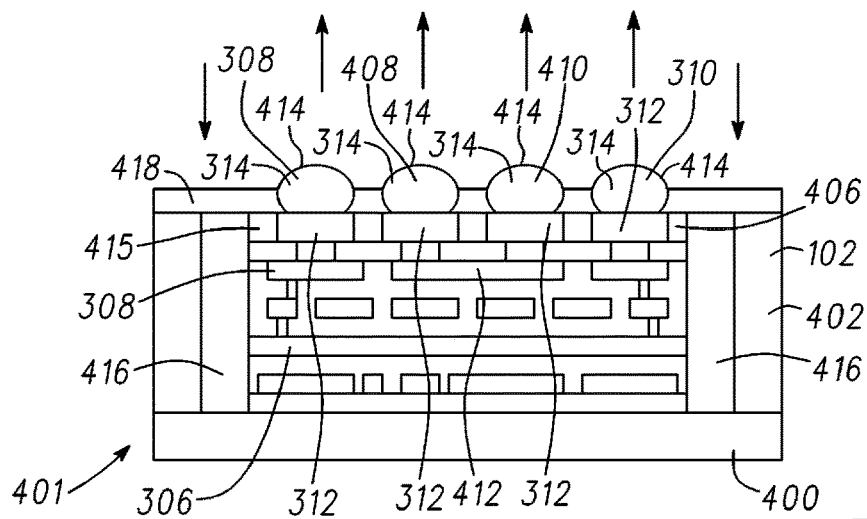
FIG. 4C is a schematic cross section of the package assembly of FIG. 4C with a package cover layer applied and penetrated by contact posts.

FIGS. 4A-C show one example of the preparation of a package body 102 for reception of a package assembly, such as the bridge 106 previously shown and described in FIGS. 1 and 2. In the example shown in FIGS. 4B and 4C, a bridge 406 similar in at least some regards to the bridge 106 previously shown in FIGS. 1 and 2 is used. Beginning at FIG. 4A, the package body 102 includes a package body substrate 402. The package body substrate 402 includes, but is not limited to, a plurality of layers built up with an Ajinomoto Build-up Film (ABF) material. The package body substrate 402 is formed in one example on a substrate, such as a conductive plane 400. In another example the package body 102 includes a plurality of conductive planes 400 including patterned layers or the like and the package body substrate 402 is built up between the conductive planes 400. For illustrative purposes herein the package body 102 in FIG. 4A is shown with the conductive plane 400 and the package body substrate 402 provided thereon.

Referring now to FIG. 4B a bridge recess 404 is formed within the package body substrate 402. As shown the bridge recess 404 is sized and shaped for reception of the bridge 406 (e.g., an example of the package assembly). In one example, the bridge recess 404 is formed by removal of the substrate 402 material, including built up ABF layers. The bridge recess 404 is formed by one or more methods of removal of portions of the package body substrate 402. The methods include, but are not limited to, etching of the material, photolithography, laser cutting to form the bridge recess 404 or the like.

As shown in FIG. 4B the bridge 406 is positioned within the bridge recess 404. The bridge 406 includes similar features to the bridge 106 previously described and shown in FIG. 3. For instance, the bridge 406 includes at least first and second contacts 308, 310 in electrical communication with a conductive trace 306. The first and second contacts 308, 310 (e.g., contact assemblies) include one or more components configured to provide a projecting contact configured for penetration of a package cover layer as described herein. In one example, the first and second contacts 308, 310 include one or more of contact pads 312 and contact posts 314 extending from the contact pads. The contact pads 312, as shown in FIG. 4B, are provided in a component layer 415 of the bridge 406, for instance including silicon dioxide ($SiO_2$).

(e.g., upwardly relative to the remainder of the package body 402). As further shown in FIG. 4B, the exemplary bridge 406 includes additional contacts, for instance third and fourth contacts 408, 410. The third and fourth contacts 408, 410, in a similar manner to the first and second contacts 308, 310, includes contact pads 312 and contact posts 314 extending therefrom. A conductive trace 412 is provided between the third and fourth contacts 408, 410 in a similar manner to the conductive trace 306 previously described herein. In one example the bridge 406 includes a plurality of such contacts and conductive traces including hundreds or even thousands of the conductive traces 306, 412 and associated contacts, such as the first, second, third and fourth contacts 308, 410, 408, 410.

As further shown in FIG. 4B the contact posts 314 of the contacts 308, 310, 408, 410 include piercing faces 414. The piercing faces 414 are formed with the contact posts 314 (in one example continuously extending from the respective contact pads 312) and provide an upstanding surface configured for penetration of a package cover layer 418 as shown in FIG. 4C and described herein. The contact posts 314 including the piercing faces 414 are formed with the bridge 406 prior to coupling of the package cover layer 418 with the bridge 406 (and the package body 102). In one example the contact posts 314 and respective piercing faces 414 are formed with one or more of patterning, deposition or the like to build the contact posts 314 and piercing faces 414 on the contact pads 312. This avoids cutting vias into a package cover layer and the misalignment and depth issues involved with cutting. Instead, the deposition or patterning process accurately positions the contact posts 314 and builds them up relative to the conductive traces 306, 412 and the contact pads 312. In one example, one or more of the contact posts 314 or the piercing faces 414 include one or more components separate relative to the remainder of the contacts 308, 310, 408, 410 including one or more solder dots, nickel plated projections or the like provided on the contact pads 312 or the remainder of the contact posts 314. For instance, the piercing faces 414 are provided by way of deposition of the solder material or nickel plating onto one or more of the respective contact pads 312 or a contact post 314 base portion coupled with the contact pads.

As shown in FIG. 4C the bridge 406 is within the bridge recess 404 and the package cover layer 418 is applied over top of the bridge 406 and fills the remainder of the bridge recess 404. Optionally, a filler 416, such as epoxy, is provided in the bridge recess 404 to fill the gap between the recess walls and the bridge 406 and retain the bridge 406 in a static position relative to the remainder of the package body 402. The bridge 406, in another example includes a die backside film that adheres the bridge 406 to the bottom wall of the bridge recess 404 prior to application of either of the package cover layer 418 or the filler 416. The bridge 406, the package body substrate 402 and the conductive plane 400 are in one example a package assembly 401. In another example, the bridge 406 or package including contacts of the type described herein (e.g., with contact posts 314) are package assemblies 401 configured for coupling with one or more devices (e.g., dice, components or the like).

As further shown in FIG. 4C, the package cover layer 418 is provided over top of the package body 102 and the bridge 406 having the piercing faces 414 on the respective contacts 308, 310, 408, 410. The piercing faces 414 penetrate the package cover layer 418, for instance an ABF film, as the film is applied over the bridge 406 and the package body 102. The contact posts 314 providing a raised profile of contacts (e.g., an array of contacts) over top of the package cover layer 418. That is to say the contact posts 314 extent to a raised location relative to the package cover layer 418. FIG. 4C shows the relative motion between the package cover layer 418 and the bridge 406 (and the package body 102) relative to one another. As shown, the piercing faces 414 are moved relatively upward toward the package cover layer 418 (alternatively the package cover layer 418 is lowered onto the piercing faces 414). The engagement of the package cover layer 418 (e.g., in a continuous configuration from edge to edge) with the piercing faces 414 penetrates the package cover layer 418 and transitions the layer 418 to a pierced configuration as shown in FIG. 4C. The piercing faces extend through the package cover layer 418 thereafter provide a raised profile for an array of contacts relative to the package cover layer 418.

Conventional formation of the contacts by cutting of the package cover layer 418 is avoided. Instead, the contacts, such as the first and second contracts 308, 310 and the third and fourth contacts 408, 410, are built from the conductive traces 306, 412 or the contact pads 312 without laser cutting of the package body substrate 402 or the bridge 406 including the package cover layer 418. Forming the contact posts 314 on one or more of the contact pads 312 or the conductive traces 306, 412 automatically aligns the posts 314 with those features. Accordingly, as the piercing faces 414 of the respective contacts penetrate the package layer 418 the resulting profiled array of contacts rising above the package cover layer 418 are automatically aligned with the respective conductive traces 306, 412 or contact pads 312. Error including, but not limited to, open contacts, poor contacts, contacts that are in electrical communication with incorrect conductive traces or the like are thereby substantially minimized, (e.g., eliminated or minimized).

Figure 5A:
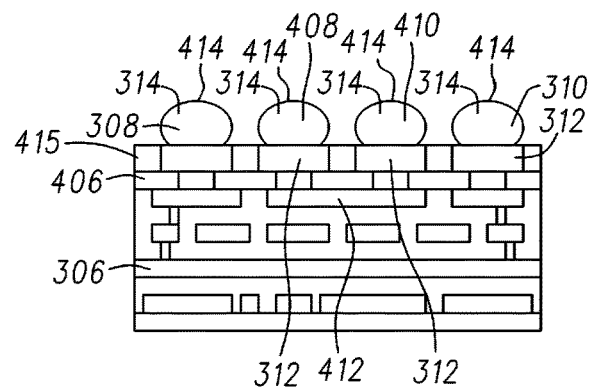
FIG. 5A is a schematic cross section of yet another example of a package assembly.
Figure 5B:
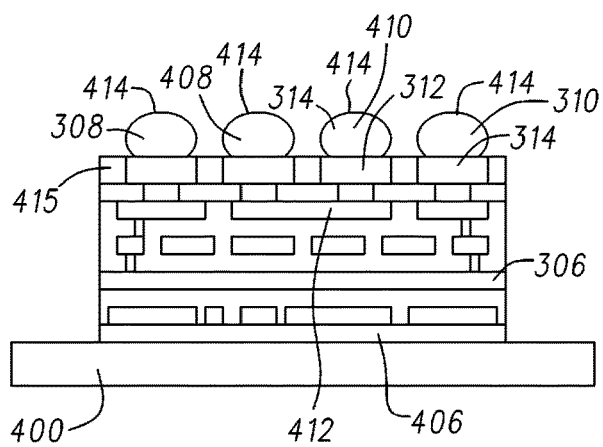
FIG. 5B is a schematic cross section of the package assembly of FIG. 5A coupled with a conductive plane.
Figure 5C:
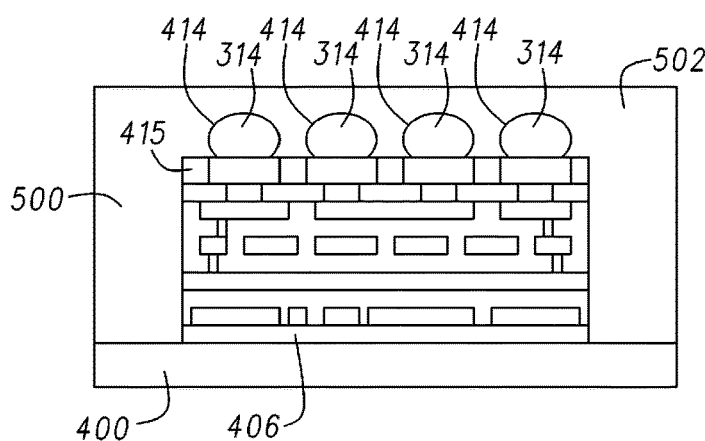
FIG. 5C is schematic cross section of the package assembly of FIG. 5B with a package cover layer applied and penetrated by contact posts.
Figure 5D:
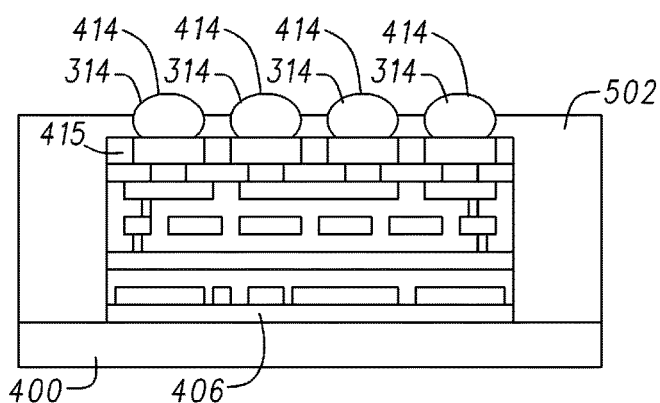
FIG. 5D is a schematic cross section of the package assembly of FIG. 5C with the contact posts revealed.

FIGS. 5A-D show another example of construction of a package assembly for instance the package assembly 502 shown in FIGS. 5C and 5D (FIG. 5C shows a partially completed version of the package assembly 502). As described herein the package assembly 502 is one example of a component of an overall assembly, for instance the composite device assembly 100 previously shown and described in FIGS. 1 and 2. In another example, the package assembly 502 is an assembly that is usable by itself. For instance the package assembly 502 provides conductive traces, contacts and the like configured for coupling with one or more components such as at least one of the devices 104 shown in FIG. 1 (e.g., dice or the like).

Referring first to FIG. 5A, the package assembly is shown in one example as a bridge 406 including a plurality of contacts such as first, second, third and fourth contacts 308, 310, 408, 410. The contacts are in one example electrically coupled with each other (308 with 310 and 408 with 410) by way of conductive traces 306, 412 respectively. As further shown in FIG. 5A, each of the contacts 308, 310, 408, 410 is in one example an assembly including a contact pad 312 and a contact post 314. As further shown in FIG. 5 each of the contact posts 314 are formed on the bridge 406 as freestanding components. Stated another way, the contact posts 314 are formed without the use of a laser used to cut through a cover layer and thereby form vias. Instead, as shown in FIG. 5A the contact posts 314 provide a freestanding profile extending from the remainder of the bridge 306. As also shown in FIG. 5A each of the contact posts includes a piercing face 414. As described herein the piercing faces 414 are used to penetrate a cover layer applied over top of the package assembly 401, including for instance the bridge 406.

Referring now to FIG. 5B, the bridge 406 is shown coupled with a conductive plane 400. Optionally, the bridge 406 is coupled to the conductive plane 400 with a die backside film (nonconductive) that adheres the bridge to the plane (the plane is optionally provided for mechanical support and does not carry current). As previously described herein, in one example the bridge 406 is installed as a component of an overall assembly, for instance the composite device assembly 100 shown in FIG. 1. In an example, the bridge 406 is installed on a conductive plane 400 forming a part of the composite device assembly 100. As shown in FIG. 5C the bridge 406 is coupled to the conductive plane 400 with a package cover layer 500 (for instance multiple layers of film applied in a Ajinomoto Build-Up Film technique) applied to the conductive plane 400 and the bridge 406. As shown, the freestanding contact posts 314 penetrate the package cover layer 500 (partially in this intermediate configuration).

As shown in FIG. 5D, a portion of the package cover layer 500 (for instance one or more layers of an ABF build-up) is removed. The portion of the layer 500 is removed by one or more methods including, but not limited to, laser removal of material (focused or broad application), plasma etching, chemical etching or the like to reveal the contact posts 314 and the piercing faces 414 already partially penetrating the cover layer 500 in FIG. 5C. In one example the piercing faces 414 of the contact posts 314 are revealed during removal of the uppermost film layers of the package cover layer 500 (e.g., penetrate through the package cover layer 500) and expose the contacts 308, 310, 408, 410 in a manner similar to the configuration shown in FIG. 4C.

As shown in FIG. 5D the package assembly 502 is in a substantially complete configuration with the contacts including the piercing faces 414 and the contact posts 314 having a raised profile relative to the remainder of the package assembly 502 including for instance the package cover layer 500. That is to say the contact posts 314 extent to a raised location relative to the package cover layer 500. As previously described herein the contact posts 314 are formed aligned to the contact pads 312 that avoids one or more of misalignment of a laser beam for cutting of the package cover layer 500 or cuts that are too shallow or too deep. Instead, the contact posts 314 are accurately formed on each of the contact pads 312 with the corresponding piercing face 414 configured to penetrate a portion of the package cover layer 500. The contact posts 314 readily reveal the contacts 308, 310, 408, 410 as the package assembly 502 is processed, for instance by way of removal of a portion of the package cover layer 500 (in ABF build-up) of the package assembly 502. The processes shown in FIGS. 4A-C and FIGS. 5A-D thereby avoid misalignment possible with lasers used to cut through a package cover layer and further avoid cuts into the package cover layer 500 than are one or more of too shallow or too deep relative to the specified contact pad 312 or conductive trace for each of the contacts.

Figure 6A:
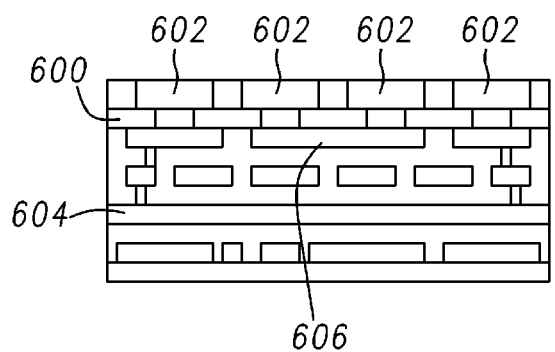
FIG. 6A is a schematic cross section of another package assembly.
Figure 6B:
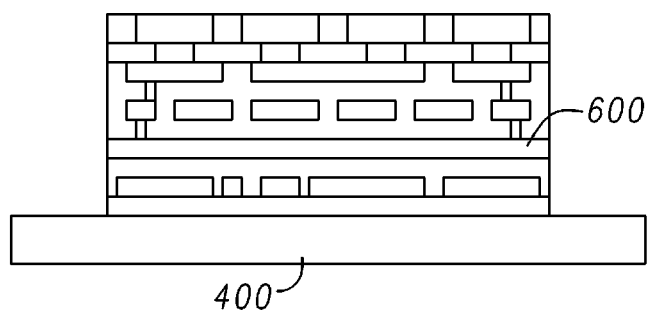
FIG. 6B is a schematic cross section of the package assembly of FIG. 6A coupled with a conductive plane.

FIG. 6A shows another example of a bridge 600. As shown, the bridge 600 includes a plurality of contact pads 602 coupled with the conductive traces 604, 606. FIG. 6B shows the bridge 600 positioned on a conductive plane 400 for instance a copper plane as part of a package assembly.

Figure 6C:
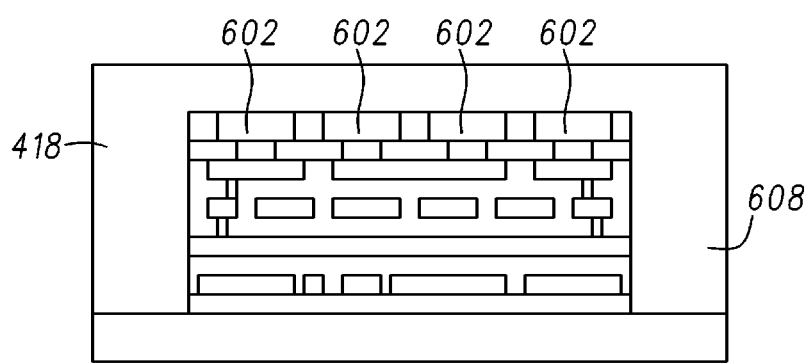
FIG. 6C is a schematic cross section of the package assembly of FIG. 6B with a package cover layer applied.
Figure 6D:
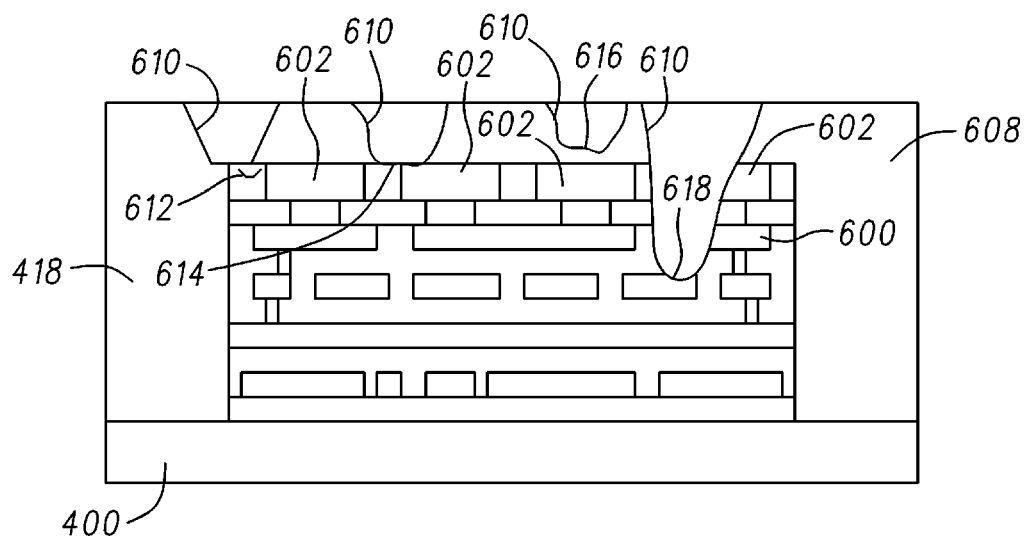
FIG. 6D is a schematic cross section of the package assembly of FIG. 6C with vias formed in the package cover layer.

Referring now to FIG. 6C, the bridge 600 is shown in a covered configuration with the package cover layer 418 applied over top of the bridge 600 including the contact pads 602. In contrast to the package assemblies described herein (e.g., package assemblies 401, 502, see FIGS. 4C and 5D) the package assembly 608 shown in FIG. 6C does not include self-aligned contacts including contact posts piercing a package cover layer. In contrast, as shown in FIG. 6D a plurality of vias 610 are cut into the package cover layer 418. As previously described herein, in an example the vias 610 are formed with one or more lasers including an ultraviolet laser, a CO2 laser or the like.

As shown in FIG. 6D a plurality of vias 610 are shown in the package cover layer 418 and illustrate a variety of issues that may cause one or more failures of the package assembly, for instance by failure to provide electrical communication between one or more solder contacts 622 (shown in FIG. 6E) and the associated contact pads 602. For instance, as shown in FIG. 6D the left most via 610 includes a misalignment gap 612 between the via 610 and the associated contact pad 602. In another example, the adjacent via 610 (second from the left) includes a weak contact 614 between the via 610 and the associated contact pad 602. The two left most vias 610 shown in FIG. 6D are formed by misalignment of a laser with the corresponding contact pads 602. As is apparent in FIG. 6C the contact pads 602 are concealed by the package cover layer 418 and alignment of the laser with the contact pads 602 is in some examples a challenge. Accordingly, misalignment errors such as the misalignment gap 612 and the weak contact 614 shown in FIG. 6D occur, especially as laser cuts are duplicated hundreds or thousands of times for a package assembly.

Two other possible issues arising from cutting vias with lasers are shown in FIG. 6D. In the right most example the via 610 includes a deep via trough 618. The deep via trough 618 extends through a portion of the associated contact pad 602 and into one or more of the lower conductive layers of the bridge 600. Conversely a shallow via trough 616 is shown next to the deep via trough 618. The shallow via trough 616 provides a gap between the via 610 and the associated contact pad 602.

Figure 6E:
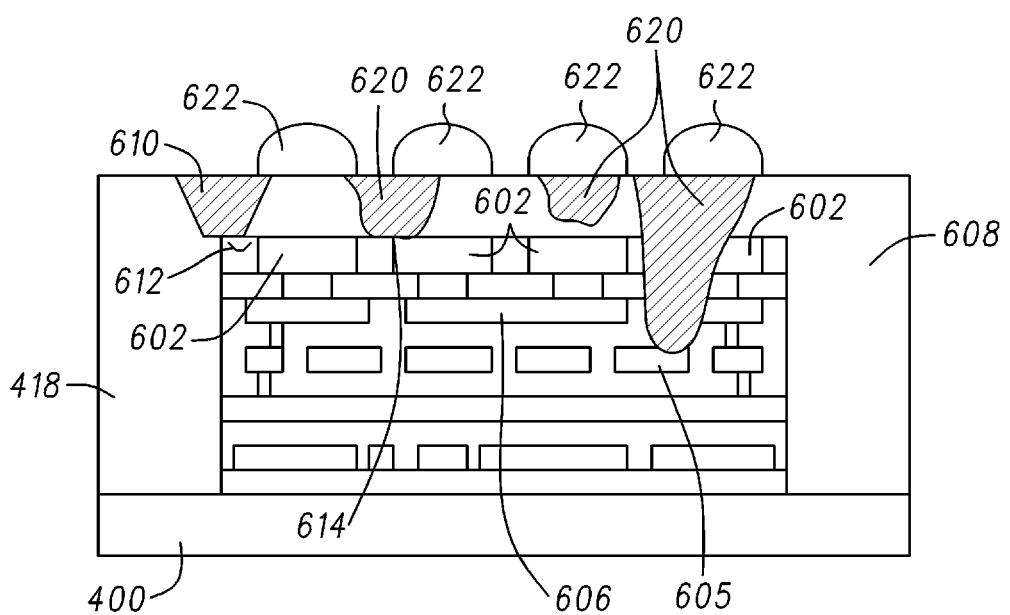
FIG. 6E is a schematic cross section of the package assembly of FIG. 6D with plated vias in the package cover layer.

FIG. 6E shows the plated vias 620 (illustrated with crosshatching) formed in each of the vias 610 previously shown in FIG. 6D and described herein. As shown the the deep via trough 618 and the shallow via trough 616 of FIG. 6D include plated vias 620 that extend to various degrees within the package assembly 608 based on the via depth. The plated via 620 formed in the deep via trough 618 extends to one or more conductive layers of the bridge 600 and thereby provide electrical contact not only to the specified conductive trace 604 but also the intervening conductive layer 605 as shown in FIG. 6E. In contrast, the plated via 620 for the shallow via trough 616 (adjacent to the plated via 620 for the deep via trough 618) fails to electrically coupled with the associated contact pad 602.

Further, the plated vias 620 associated with the left vias 610 shown in FIG. 6D also provide one or more connectivity issues for the package assembly 608 as shown in FIG. 6E. The plated via 620 for the left most contact pad 602 is spaced from the contact pad by the misalignment gap 612 and thereby fails to make connection to the the associated contact pad 602 and the conductive trace 604. In a similar manner the adjacent plated via 620 (second from the left) provides intermittent communication because of the weak contact 614. For instance, copper plating provided within the via 618 provides intermittent or irregular communication between the contact pad 602 and the associated plated via 620.

As previously described herein, in some examples the issues arising with cutting of the package cover layer 418 for instance to form the vias 610 shown in FIG. 6D and the corresponding plated vias 620 arise from misalignment or inaccurate cutting of a laser through the package cover layer 418. Because the vias such as the vias 610 shown in FIG. 6D are duplicated hundreds or thousands of times for a package assembly one or more errors at even one of the contact pads 602 and the associated plated vias 620 may cause a fatal error in the package assembly 608 that requires discarding of the assembly. Further, if the package assembly 608 including an error (described above) is incorporated as a component of a composite package assembly (having other package assemblies, devices or the like) the composite package assembly may be discarded because of the error. For instance, in a composite package assembly including a plurality of bridges 600 shown in FIG. 6E even one misalignment of a plated via 620 relative to an associated contact pad 602, a shallow via 620, or a deep via 620 as shown in 6E may cause a fatal error for the entire package assembly thereby requiring discarding of the package assembly. The production process including cutting of vias is repeated until a package assembly (also prone to the errors described herein) is produced without these errors.

Figure 7:
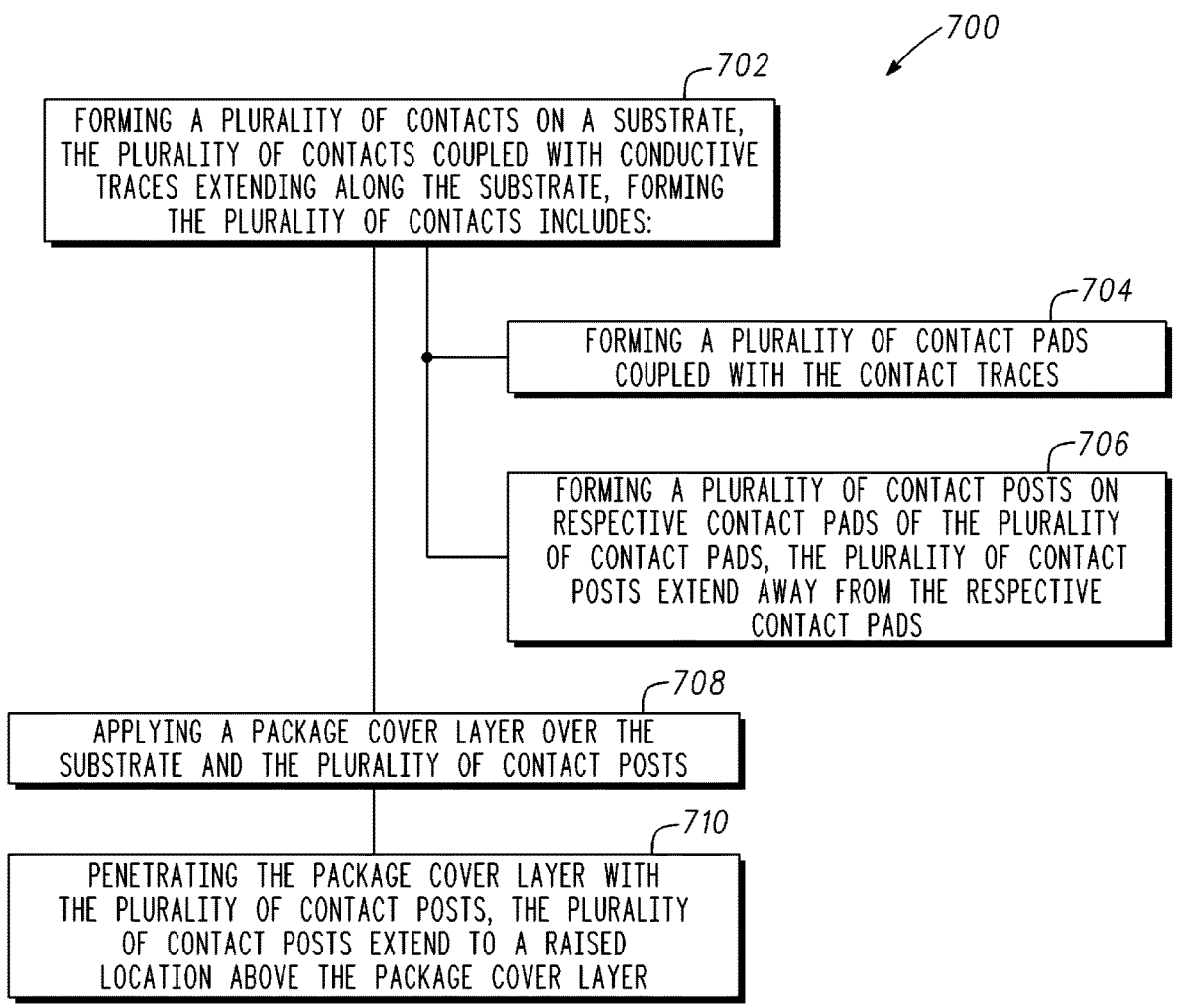
FIG. 7 is a block diagram showing one example of a method of making a package assembly.

FIG. 7 shows one example of the method 700 for making a package assembly such as the package assemblies described herein. In describing the method 700 reference is made to one or more components, features, functions and steps previously described herein. Where convenient reference is made to the components, features, steps and the like with reference numerals. Reference numerals provided are exemplary and are nonexclusive. For instance features, functions, steps and the like described in the method 700 include, but are not limited to, the corresponding numbered elements provided herein other corresponding features described herein (both numbered and unnumbered) as well as their equivalents.

At 702, the method 700 includes forming a plurality of contacts, for instance one or more of the contacts 308, 310, 408, 410 shown in FIGS. 4B and 4C on a substrate (e.g., a substrate including one or more of the components of the bridge 406 or any of the other bridge or package assembly examples described herein). The substrate includes one or more of the exemplary bridge 406 (an example of the package assembly), the package assembly 502, a composite device assembly 100 (another example of a package assembly) including the package body 102, as well as portions of the same (e.g. one or more layers of these assemblies). Forming the plurality of contacts includes at 704 forming a plurality of contact pads 312 as described herein coupled with one or more conductive traces such as the conductive traces 306, 412.

At 706, forming the plurality of contacts on the substrates includes forming a plurality of contact posts 314 on respective contact pads 312 (e.g., optionally the contact pads include portions of the conductive traces 306, 412). The plurality of contact posts 314 extend away from the respective contact pads. In one example, the plurality of contact posts 314 each include a piercing face 414 configured for piercing of a package cover layer for instance the cover layer 418 shown in FIG. 4C (and package cover layer 500 shown in FIGS. 5C and 5D).

At 708, a package cover layer 418 (or 500) is applied over the substrate and the plurality of contact posts 314. In one example the package cover layer 418 is provided in a continuous configuration as a film extending continuously between first and second film edges. One example of the first and second film edges is shown in FIG. 4C and corresponds to the left most and right most portions of the package cover layer 418 shown in FIG. 4C.

At 710, the package cover layer 418 is penetrated with the plurality of contact posts 314, for instance with one or more piercing faces 414 associated with each of the contact posts 314. That is to say, the package cover layer 418 (e.g., a film) is penetrated by the plurality of contact posts 314 between the first and second film edges previously described with regard to FIG. 4C. Penetration includes piercing the package cover layer 418 or partially penetrating the package cover layer 500 (FIG. 5C) followed by removal of a portion of the cover layer to reveal the contact posts 314. The contact posts 314 extend to a location above the package cover layer 418 (or 500). Stated another way, the contact posts 314 provide an array of contacts having a raised profile relative to the cover layers.

Several options for the method 700 follow. In one example the method 700 includes, as previously described herein, forming the plurality of contact posts 314. In one example the method 700 includes aligning the plurality of contact posts 314 with respective contact pads 312 before application of the package cover layer 418. That is to say, the contact posts 314 are formed without cutting of a previously applied package layer for instance to form one or more of the vias 610 previously shown and described with regard to FIG. 6E. Instead, the contact posts 314 are automatically aligned by way of deposition (e.g., one or more of a deposition method including patterning, deposition of conductive material or the like onto the substrate of the package assembly). The cutting of vias into the substrate is not required. Accordingly, the package assembly (including either or both of the bridge 106 the other bridges described herein or the composite device assembly 100) is provided with contact posts 314 that are automatically aligned with the contact pads (including the conductive traces) and is thereby free of cutting of the package layer 418 by lasers.

In another example, forming the plurality of contact posts 314 includes patterning a conductive material over the substrate, for instance the substrate of one or more of the bridges 106, 406 (e.g., generally package assemblies and not just bridges) or the like. For instance, the plurality of contact posts 314 are formed by one or more of covering the substrate of the bridges 106, 406 and then revealing the contact pads with a lithography technique and electroplating nickel on the pads or application of a dry film and printing of a solder paste on the pads. Patterning the conductive material includes forming the contact posts 314 as well as the piercing faces 414 through a masking and etching process. In another example, forming the plurality of contact posts 314 includes forming a plurality of solder posts (e.g., nickel posts or the like) on the respective contact pads 312. As previously described herein, the solder posts are in one example deposited on the contact pads 312 with one or more methods including but not limited to patterning of the solder posts, deposition of the solder posts or the like.

In still another example, the plurality of contact posts 314 each include a piercing face 414 as described herein. Penetrating the package cover layer 418 shown in FIG. 4C includes in one example full penetration of the package cover layer (e.g., an ABF film) with the piercing faces 414. Other examples of penetration of the package cover layer 500 are shown and discussed herein. For instance the package cover layer 500 is shown in one example as applied in FIG. 5C. In such an example a portion of the package cover layer 500 is penetrated by the contact posts 314, and portions of the package cover layer 500 are removed from the package assembly 502 (e.g. by broad application of a laser, directed laser application, removal of the package cover layer with a mechanical removal technique, removal by way of an etchant or the like) to thereby reveal the contact posts 314 including the piercing faces 414 extending through the package cover layer 500.

Optionally, the method 700 further includes coupling first and second devices, including but not limited to one or more of the devices 104 shown in FIG. 1 and one or more of the first and second devices 104A, 104B shown in FIG. 2, with a package body 102. Each of the devices 104 (including the first and second devices 104A, 104B) include respective first and second device edges 200, 202. As shown in FIG. 2 the first and second device edges 200, 202 are proximate one another (e.g., immediately adjacent or the like). The method 700 further includes electrically bridging the first and second devices 104A, 104B at the first and second device edges 200, 201 with the bridge 106.

In still another example, the method 700 further includes seating the bridge within a bridge recess 404 as shown for instance in FIG. 4B. In an example the bridge recess 404 is formed in a package body 102 (e.g., of the composite device assembly 100 shown in FIG. 1). After seating of the bridge 406 therein in one example a filler 416, such as an epoxy resin, is applied therein to couple the bridge 406 with the package body 102.

EXAMPLES

Example 1 can include subject matter, such as can include a package assembly comprising: a substrate extending from a first substrate end to a second substrate end; a plurality of conductive traces extending along the substrate; a plurality of contacts coupled with the respective conductive traces of the plurality of conductive traces, each of the contacts of the plurality of contacts includes: a contact pad coupled with a respective conductive trace of the plurality of conductive traces, and a contact post coupled with the contact pad, the contact post extends from the contact pad; and a package cover layer coupled over the plurality of contact posts, the plurality of contact posts are configured to penetrate the package cover layer and extend to a raised location above the package cover layer.

Example 2 can include, or can optionally be combined with the subject matter of Example 1, to optionally include a silicon bridge includes the substrate, plurality of conductive traces and the plurality of contacts, and the silicon bridge is configured to bridge between at least two devices.

Example 3 can include, or can optionally be combined with the subject matter of one or any combination of Examples 1 or 2 to optionally include a first device and a second device having respective first and second device ends proximate each other, contact posts of the plurality of contact posts at the first substrate end of the substrate are coupled with the first device proximate the first device end, and contact posts of the plurality of contact posts at the second substrate end of the substrate are coupled with the second device proximate the second device end.

Example 4 can include, or can optionally be combined with the subject matter of one or any combination of Examples 1-3 to optionally include the contact post includes a piercing face configured to penetrate the package cover layer.

Example 5 can include, or can optionally be combined with the subject matter of one or any combination of Examples 1-4 to optionally include the contact post continuously extends from the respective contact pad to the raised location.

Example 6 can include, or can optionally be combined with the subject matter of Examples 1-5 to optionally include the contact post includes a solder post.

Example 7 can include, or can optionally be combined with the subject matter of Examples 1-6 to optionally include the package cover layer includes a film, and the film includes a continuous configuration and a penetrated configuration: in the continuous configuration the film extends continuously between first and second film edges, and in the penetrated configuration the film is penetrated by the plurality of contact posts between the first and second film edges.

Example 8 can include, or can optionally be combined with the subject matter of Examples 1-7 to optionally include the plurality of contact posts are patterned contact posts.

Example 9 can include, or can optionally be combined with the subject matter of Examples 1-8 to optionally include a package assembly comprising: a package body; at least first and second devices coupled with the package body, each of the first and second devices includes respective first and second device edges and the first and second device edges are proximate to each other and include respective first and second device contacts; and a bridge within the package body, the bridge extends between the first and second device contacts at the first and second device edges, the bridge includes: a substrate extending from a first substrate end to a second substrate end, the first and second substrate ends proximate the respective first and second device edges, conductive traces extending along the substrate, at least first and second contacts coupled with the conductive traces, the first and second contacts coupled with the respective first and second device contacts at the first and second device edges, and each of the first and second contacts includes: a contact pad coupled with a respective conductive trace of the conductive traces, and a contact post coupled with the contact pad, the contact post extends from the contact pad to one of the first or second device contacts, and a package cover layer coupled over the plurality of contact posts, the plurality of contact posts penetrate the package cover layer and extend to a raised location above the package cover layer.

Example 10 can include, or can optionally be combined with the subject matter of Examples 1-9 to optionally include the package cover layer includes a film, and the film includes a continuous configuration and a penetrated configuration: in the continuous configuration the film extends continuously between first and second film edges, and in the penetrated configuration the film is penetrated by the plurality of contact posts between the first and second film edges.

Example 11 can include, or can optionally be combined with the subject matter of Examples 1-10 to optionally include the contact post includes a piercing face configured to penetrate the package cover layer.

Example 12 can include, or can optionally be combined with the subject matter of Examples 1-11 to optionally include the contact post continuously extends from the respective contact pad to the raised location.

Example 13 can include, or can optionally be combined with the subject matter of Examples 1-12 to optionally include the contact post includes a solder post.

Example 14 can include, or can optionally be combined with the subject matter of Examples 1-13 to optionally include the plurality of contact posts are patterned contact posts.

Example 15 can include, or can optionally be combined with the subject matter of Examples 1-14 to optionally include the package body includes at least one bridge recess extending from the first device edge to the second device edge, and the at least one bridge recess receives the bridge.

Example 16 can include, or can optionally be combined with the subject matter of Examples 1-15 to optionally include a method of making a package assembly comprising: forming a plurality of contacts on a substrate, the plurality of contacts coupled with conductive traces extending along the substrate, forming the plurality of contacts includes: forming a plurality of contact pads coupled with the conductive traces, forming a plurality of contact posts on respective contact pads of the plurality of contact pads, the plurality of contact posts extend away from the respective contact pads; applying a package cover layer over the substrate and the plurality of contact posts; and penetrating the package cover layer with the plurality of contact posts, the plurality of contact posts extend to a raised location above the package cover layer.

Example 17 can include, or can optionally be combined with the subject matter of Examples 1-16 to optionally include forming the plurality of contact posts includes aligning the plurality of contact posts with the respective contact pads before application of the package cover layer.

Example 18 can include, or can optionally be combined with the subject matter of Examples 1-17 to optionally include forming the plurality of contact posts includes patterning a conductive material over the substrate.

Example 19 can include, or can optionally be combined with the subject matter of Examples 1-18 to optionally include forming the plurality of contact posts includes forming a plurality solder posts on the respective contact pads.

Example 20 can include, or can optionally be combined with the subject matter of Examples 1-19 to optionally include the plurality of contact posts each include a piercing face, and penetrating the package cover layer includes piercing the package cover layer with the piercing faces of the plurality of contact posts.

Example 21 can include, or can optionally be combined with the subject matter of Examples 1-20 to optionally include applying the package cover layer includes filling gaps between the contact posts with the package cover layer.

Example 22 can include, or can optionally be combined with the subject matter of Examples 1-21 to optionally include a bridge includes the substrate, plurality of conductive traces and the plurality of contacts, and comprising:

coupling first and second devices with a package body, the first and second devices include first and second device edges proximate each other; and electrically bridging the first and second devices at the first and second device edges with the bridge, and the plurality of contact posts couple with first or second device contacts at the first and second device edges.

Example 23 can include, or can optionally be combined with the subject matter of Examples 1-22 to optionally include seating the bridge within a package recess formed in the package body.

The invention claimed is:

1. A package assembly comprising:
a substrate extending from a first substrate end to a second substrate end;
a plurality of conductive traces extending along the substrate;
a plurality of contacts coupled with respective conductive traces of e plurality of conductive traces, each of the plurality of contacts includes:
a contact pad coupled with a respective conductive trace of the plurality of conductive traces, and
a continuous contact post the continuous contact post extends from the contact pad, wherein a widest dimension of the continuous contact post is below a top surface of the continuous contact post; and
a package cove layer coupled over a plurality of contact posts that includes the continuous contact post, the plurality of contact posts are configured to penetrate the package co layer and extend to a raised location above the package cover layer.

2. The package assembly of claim 1, a silicon bridge includes the substrate, the plurality of conductive traces and the plurality of contacts, and the silicon bridge is configured to bridge between at least two devices.

3. The package assembly of claim 2, comprising a first device and a second device having respective first and second device ends proximate each other,
contact posts of the plurality of contact posts at the first substrate end of the substrate are coupled with the first device proximate the first device end, and
contact posts of the plurality of contact posts at the second substrate end of the substrate are coupled with the second device proximate the second device enol.

4. The package assembly of claim 1, the continuous contact post includes a piercing face configured to penetrate the package cover layer.

5. The package assembly of claim 1, the continuous contact post continuously extends from a respective contact pad to the raised location.

6. The package assembly of claim 1, the continuous contact post includes a solder post.

7. The package assembly of claim 1, the package cover layer includes a film, and the film includes a continuous configuration and a penetrated configuration:
in the continuous configuration the film extends continuously between first and second film edges, and
in the penetrated configuration the film is penetrated by the plurality of contact posts between the first and second film edges.

8. The package assembly of claim 1, the plurality of contact posts are patterned contact posts.

9. A package assembly comprising:
a package body;
at least first and second devices coupled with the package body, each of the first and second devices includes respective first and second device edges and the first and second device edges are proximate to each other and include respective first and second device contacts; and
a bridge within the package body, the bridge extends between the first and second device contacts at the first and second device edges, the bridge includes:
a substrate extending from a first substrate end to a second substrate end, the first and second substrate ends proximate the respective first and second device edges,
conductive traces extending along the substrate,
at least first and second contacts coupled with the conductive traces, the at least first and second contacts coupled with the respective first and second device contacts at the first and second device edges, and each of the at least first and second contacts includes:
a contact pad coupled with a respective conductive trace of the conductive traces, and
a continuous contact post, the continuous contact post extends from the contact pad to one of the first or second device contacts, wherein a widest dimension of the continuous contact post is below a top surface of the continuous contact post, and
a package cover layer coupled over a plurality of contact posts that includes the continuous contact post, the plurality of contact posts penetrate the package cover layer and extend to a raised location above the package cover layer.

10. The package assembly of claim 9, the package cover layer includes a film, and the film includes a continuous configuration and a penetrated configuration:
in the continuous configuration the film extends continuously between first and second film edges, and
in the penetrated configuration the film is penetrated by the plurality of contact posts between the first and second film edges.

11. The package assembly of claim 9, the continuous contact post includes a piercing face configured to penetrate the package cover layer.

12. The package assembly of claim 9, the continuous contact post continuously extends from a respective contact pad to the raised location.

13. The package assembly of claim 9, the continuous contact post includes a solder post.

14. The package assembly of claim 9, the plurality of contact posts are patterned contact posts.

15. The package assembly of claim 9, the package body includes at least one bridge recess extending from the first device edge to the second device edge, and the at least one bridge recess receives the bridge.

16. A method of making a package assembly comprising:
forming a plurality of contacts on a substrate, the plurality of contacts coupled with conductive traces of a bridge, forming the plurality of contacts includes:
forming a plurality of contact pads coupled with the conductive traces,
forming a plurality of contact posts on respective contact pads of the plurality of contact pads, the plurality of contact posts extend away from the respective contact pads;
applying a package cover layer over the substrate and the plurality of contact posts;
penetrating the package cover layer with the plurality of contact posts, the plurality of contact posts extend to a raised location above the package cover layer; and
coupling first and second devices with the package assembly, the first and second devices include first and second device edges proximate each other; and electrically bridging the first and second devices at the first and second device edges with the bridge, and the plurality of contact posts couple with first or second device contacts at the first and second device edges.

17. The method of claim 16, forming the plurality of contact posts includes aligning the plurality of contact posts with the respective contact pads before application of the package cover layer.

18. The method of claim 16, forming the plurality of contact posts includes patterning a conductive material over the substrate.

19. The method of claim 16, forming the plurality of contact posts includes forming a plurality solder posts on the respective contact pads.

20. The method of claim 16, the plurality of contact posts each includes a piercing face, and penetrating the package cover layer includes piercing the package cover layer with piercing faces of the plurality of contact posts.

21. The method of claim 16, applying the package cover layer includes filling gaps between the plurality of contact posts with the package cover layer.

22. The method of claim 16, further comprising seating the bridge within a package recess formed in the package body.

* * * * *